: US005691226A

United States Patent [19]
Foerstner et al.

[11] Patent Number: 5,691,226
[45] Date of Patent: Nov. 25, 1997

[54] METHOD OF MANUFACTURING BICMOS INTEGRATED CIRCUITS

[75] Inventors: Juergen Foerstner, Mesa, Ariz.;
Myriam Combes, Plaisance-du-Touch, France; Arlette Marty-Blavier, Frouzins, France; Guy Hautekiet, Plaisance-du-Touch, France

[73] Assignee: Motorola, Inc., Schaumburg, Ill.

[21] Appl. No.: 672,522

[22] Filed: Jun. 25, 1996

[30] Foreign Application Priority Data

Jun. 30, 1995 [FR] France .................................. 95 07904

[51] Int. Cl.$^6$ .................................................. H01L 21/8249
[52] U.S. Cl. .......................... 437/59; 437/57; 148/DIG. 9
[58] Field of Search ........................... 437/31, 34, 56, 437/57, 59; 148/DIG. 9

[56] References Cited

U.S. PATENT DOCUMENTS

| | | | |
|---|---|---|---|
| 5,001,073 | 3/1991 | Huie | 148/DIG. 9 |
| 5,011,784 | 4/1991 | Ratnakumar | 437/59 |
| 5,091,321 | 2/1992 | Huie et al. | 148/DIG. 9 |
| 5,179,036 | 1/1993 | Matsumoto | 437/59 |
| 5,192,992 | 3/1993 | Kim et al. | 437/57 |
| 5,245,209 | 9/1993 | Ishigaki | 257/370 |
| 5,406,106 | 4/1995 | Hirai et al. | 257/378 |

FOREIGN PATENT DOCUMENTS 2137262  5/1990  Japan.

*Primary Examiner*—Chandra Chaudhari
*Attorney, Agent, or Firm*—Harry A. Wolin; Rennie William Dover

[57] ABSTRACT

A method of manufacturing both bipolar and CMOS devices including vertical PNP, NPN, PMOS and NMOS devices on the same chip, includes the steps of, simultaneously forming an N+ region (14) on part of a P base region (11) of the vertical NPN device to form the emitter contact region thereof, an N+ region (14) on a part of an N– epitaxial layer (5) of the vertical NPN device to form the collector contact region thereof, N+ regions (14) on first and second parts of a P well region (8) of the NMOS device to form the source and drain thereof, and an N+ region (14) on an N base region (9) of the vertical PNP device to form the base contact thereof. In a further simultaneous step, there are formed P+ regions (15) on the P-well (8) and N base (9) regions of the vertical PNP device to form the collector and emitter contact regions thereof, P+ regions (15) on first and second parts of the N– epitaxial layer (5) of the PMOS device to form the source and drain thereof, and a P+ region (15) on part of the P base region (11) of the vertical NPN device to form the base contact region thereof.

4 Claims, 12 Drawing Sheets

METHOD OF MANUFACTURING BICMOS INTEGRATED CIRCUITS

FIELD OF THE INVENTION

This invention relates to a method of manufacturing integrated circuits, more particularly to a method of manufacturing both bipolar and CMOS devices on the same integrated circuit.

BACKGROUND OF THE INVENTION

It is known to manufacture semiconductor devices having both CMOS and bipolar devices on the same chip. This is usually known as BiCMOS technology, where the basic semiconductor chip is formed in CMOS technology with some extra bipolar technology added, as needed, or where the basic process is bipolar incorporating some CMOS.

It is an object of the present invention to provide a BiCMOS process which more fully integrates the manufacture of both bipolar and CMOS devices on the same chip.

BRIEF SUMMARY OF THE INVENTION

Accordingly, the invention provides a method of manufacturing integrated circuits having both bipolar and CMOS devices on the same chip, the method comprising the steps of:

providing a P− silicon substrate appropriately doped to provide an N− buried layer region for at least one vertical PNP device and to provide N+ buried layer regions for at least one PMOS device and at least one vertical NPN device;

providing a P+ region in the N− buried layer region and in the P− substrate for at least one NMOS device;

providing an N− epitaxial layer over the P+, N+ and N− regions;

providing a P well region in the N− epitaxial layer of the NMOS device extending to the P+ region and in a first part of the N− epitaxial layer of the vertical PNP device extending to the P+ region;

providing an N base region in a second part of the N− epitaxial layer of the vertical PNP device;

providing a P base region in a first part of the N− epitaxial layer of the vertical NPN device;

simultaneously providing:

an N+ region on part of the P base region of the vertical NPN device to form the emitter thereof, an N+ region on a second part of the N− epitaxial layer of the vertical NPN device to form the collector contact thereof, N+ regions on first and second parts of the P well region of the NMOS device to form the source and drain thereof, and an N+ region on the N base region of the vertical PNP device to form the base contact thereof; and simultaneously providing:

P+ regions on the P well and N base regions of the vertical PNP device to form the collector and emitter contacts thereof, P+ regions on first and second parts of the N− epitaxial layer of the PMOS device to form the source and drain thereof, and a P+ region on part of the P base region of the vertical NPN device to form the base contact thereof.

In a preferred embodiment, the method further comprises the step of:

providing a deep N+ region in the second part of the N− epitaxial layer of the vertical NPN device before the N+ region forming the collector contact thereof is formed.

Preferably, an N− buried layer region is provided in the P− substrate for the NMOS device before the P+ region is provided therein.

Preferably, the N base region of the vertical NPN device is provided on a P++ region provided in the second part of the N− epitaxial layer of the vertical NPN device.

BRIEF DESCRIPTION OF THE DRAWINGS

The steps involved in a process according to one embodiment of the invention to form NPN, PNP, PMOS and NMOS devices on a single substrate will now be more fully described, by way of example, with reference to the drawings, of which.

DETAILED DESCRIPTION OF THE DRAWINGS

Figure 1:
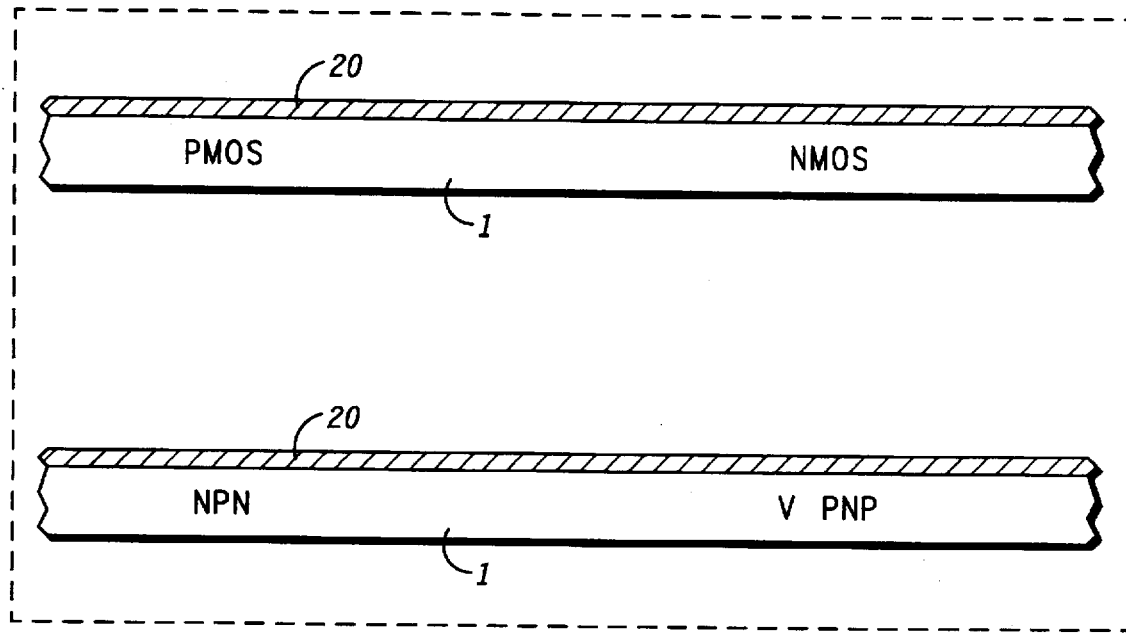
FIGS. 1 to 23 show the steps involved in producing NPN, Vertical PNP, PMOS and NMOS devices on a single substrate using the method of the invention.

Thus, as shown in FIG. 1, a starting semiconductor wafer 1 is of P-type monocrystalline silicon substrate with a <100> crystallographic orientation, having 6 to 8.5 Ohm-cm bulk resistivity. The substrate 1 is thermally oxidized until an oxide layer 20 of approximately 1500Å thickness is produced thereon.

Figure 2:
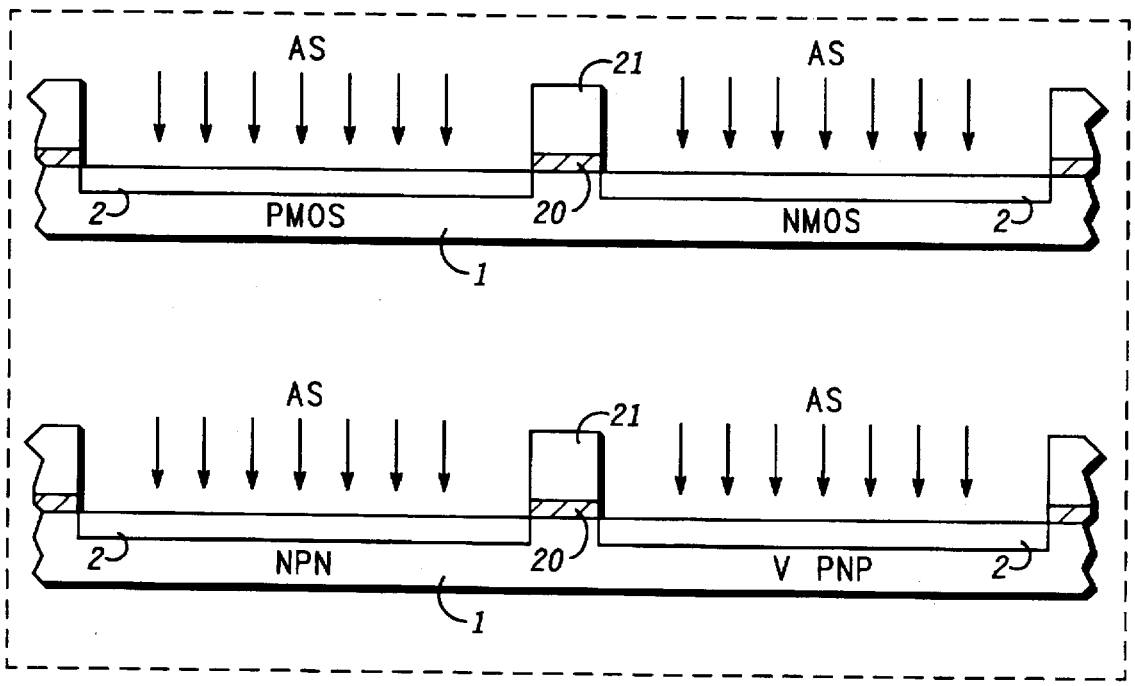

Two N-type buried layers regions are then defined by means of a first masking or patterning step with photoresist, indicated by reference 21 in FIG. 2, and by a subsequent wet etch of the exposed oxide layer 20 until the underlying silicon substrate 1 is exposed, as shown. An Arsenic (As) ion implantation is then performed, as shown schematically in FIG. 2. The dose is about 2.5E13 at/cm$^2$, and the energy is approximately 50 KeV. After removing completely the residual photoresist 21, an annealing treatment is performed, slightly re-oxidizing the exposed surface of the silicon substrate 1 to about 200Å. The annealing cycle is as follows: firstly, the wafers are driven for approximately 90 seconds in an oxygen ($O_2$) atmosphere; next, hydrogen chloride (HCl) is introduced to about 3% of the total atmosphere and a dry oxidation is done for approximately 19 minutes; finally, the wafers are driven for approximately 300 minutes in a nitrogen ($N_2$) atmosphere. The Arsenic previously implanted thus diffuses in the substrate 1 to form N− buried layers, indicated by reference 2 in FIG. 2, in the defined areas of the surface of the substrate 1.

Figure 3:
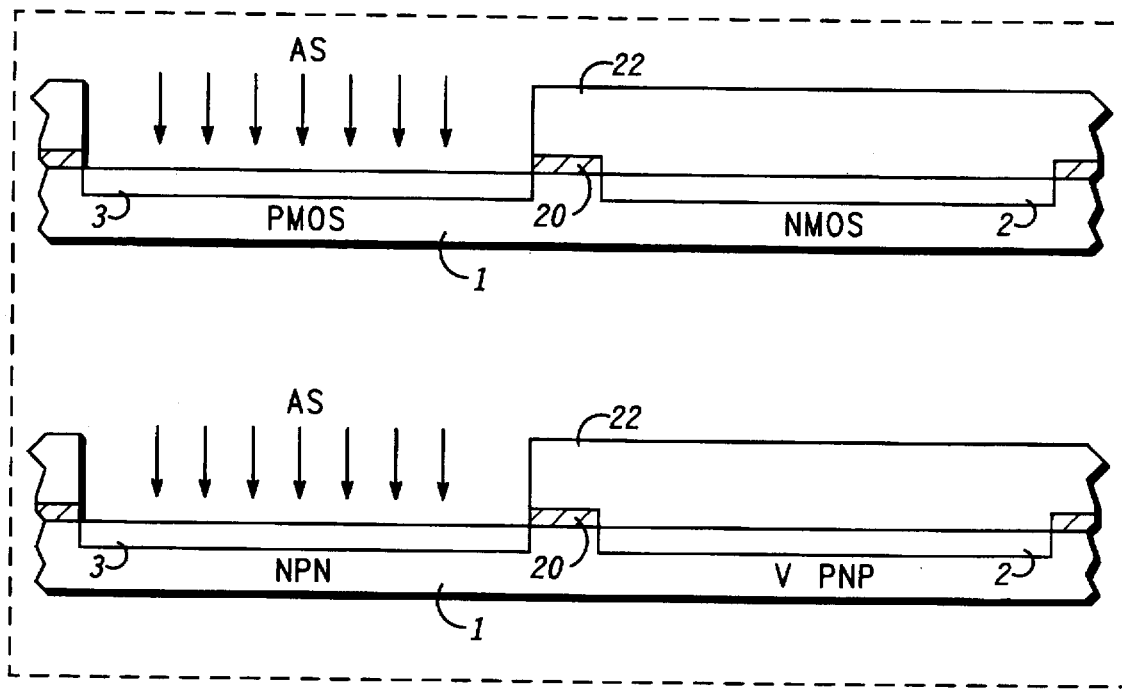

Next, a second masking or patterning step with photoresist 22, as shown in FIG. 3, is carried out, masking at least the previously doped area for the NMOS device and the vertical PNP device and leaving the NPN and PMOS areas unmasked. Then a heavy Arsenic implant is carried out, as shown schematically in FIG. 3. The dose is about 5E15 at/cm$^2$, and the energy is approximately 50 KeV. After removing completely the residual photoresist 22, the exposed surfaces are thermally re-oxidized: firstly, a dry oxidation is performed with 3% HCl for approximately 10 minutes at about 890° C.; then, a steam cycle is carried out at about 890° C. for approximately 39 minutes; and finally the wafers are driven for approximately 95 minutes in $N_2$ at about 1200° C.

At this point in the process, the N− and N+ regions are clearly defined. The regions submitted only to the first implant step become N– layers 2, and the regions where both implant steps were performed become N+ layers 3. Both the N– and N+ regions are self-aligned since their locations were defined by means of only one patterning step, the first one. The N– buried layers 2, which provide isolation of the collector of the vertical PNP device, indicate the future location of the isolated collector vertical PNP device as well as the location of the NMOS device, and the N+ buried layers 3, which provide the collector of the NPN device, indicate the future location of the NPN device as well as the location of the PMOS device.

Figure 4:
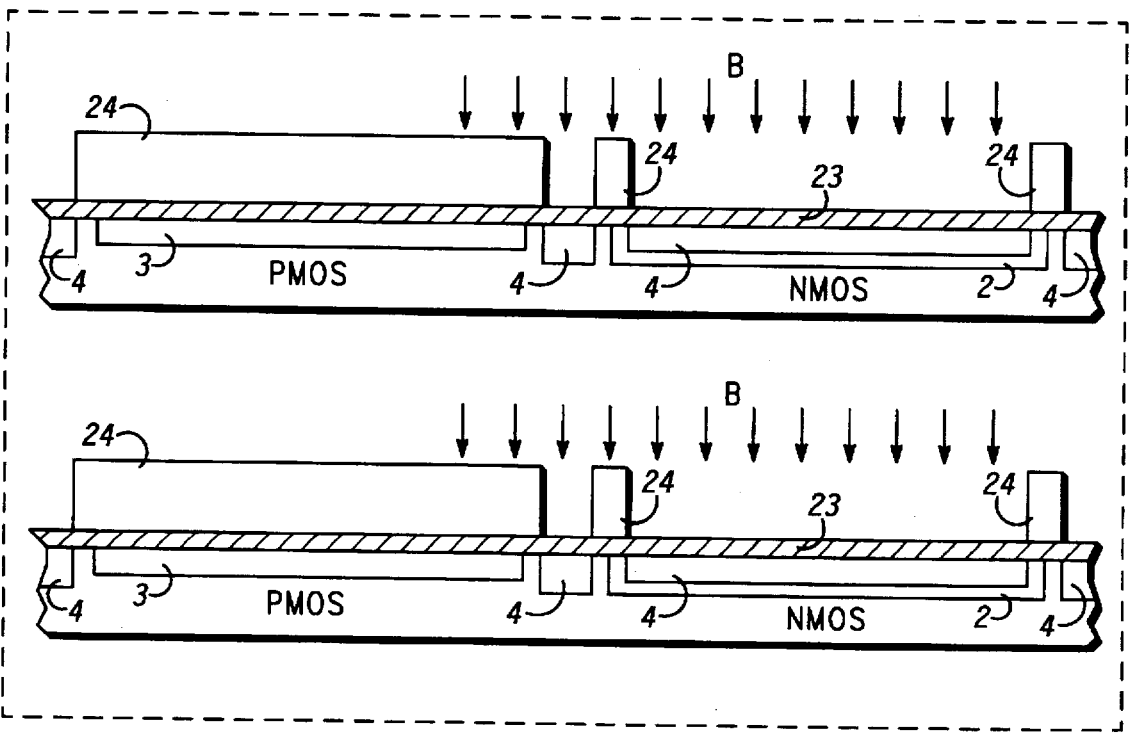

After an accurate removal of the silicon oxide, in a 4:1 hydrofluoric acid (HF) solution for approximately 5 minutes, a thermal oxide 23 of about 700Å thickness is grown to be used as a mask for the next implant, as shown in FIG. 4. A third masking step is then performed by covering the thermal oxide 23 with a layer of photoresist 24. Appropriate patterns are opened in the photoresist layer 24, and Boron (B) is implanted with an energy of about 40 KeV and a dose of approximately 1.3E14 at/cm$^2$ as shown schematically in FIG. 4. The photoresist 24 is then removed and the implanted Boron is first annealed at about 1080° C. in $N_2$ for about 35 minutes, then driven in $O_2$ for about 10 minutes at about 1080° C. and finally driven in ($O_2$/1% HCl) atmosphere at about 1080° C. for approximately 10 minutes, thereby creating P+ layers 4.

Figure 5:
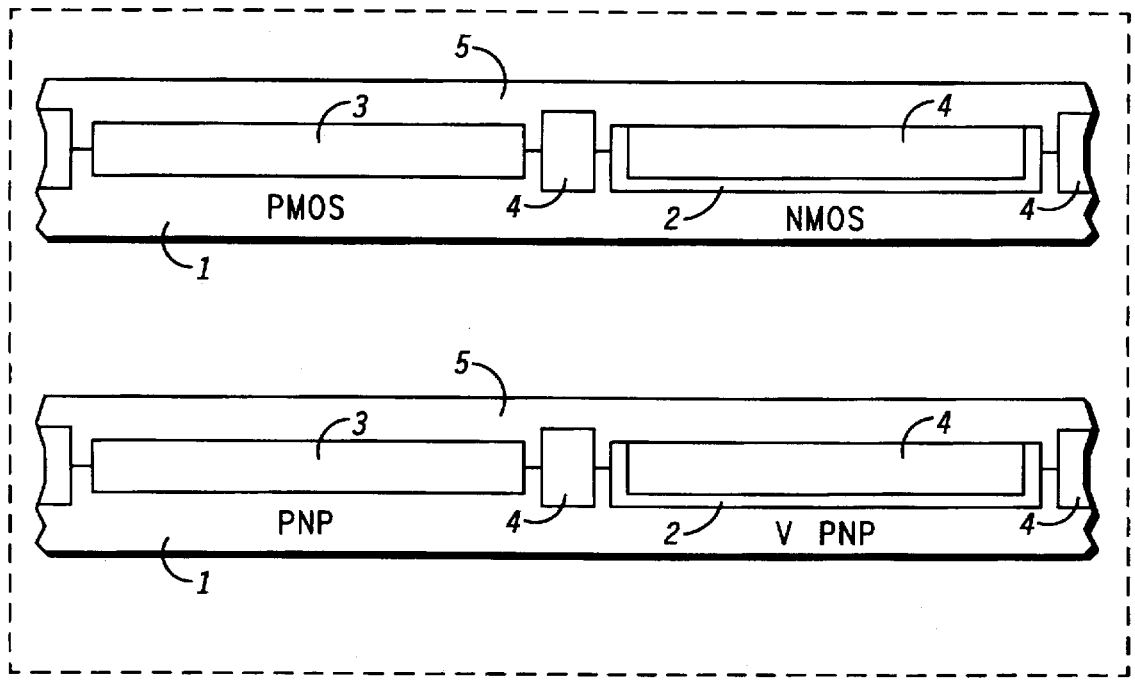

After an accurate removal of the silicon oxide, an epitaxial layer 5 of N-type, arsenic doped silicon, approximately 2 μm thick, having a bulk resistivity around 0.90 Ohm·cm, is grown, as shown in FIG. 5. With the epitaxial growth, which takes place at a relatively high temperature, the Arsenic and Boron, previously implanted and driven in defined areas, diffuse again to form N–, N+ and P+ buried layers, indicated respectively by reference numerals 2, 3 and 4 in FIG. 5. The resulting N– layer 2 is deeper than the P+ layer 4, so that, in the areas where both N– and P+ implants are performed, the P+ buried layer 4 is isolated from the substrate 1 by the N– buried layer 2. This P+ buried layer 4 provides a celteeter for the vertical PNP device and will also be used for the NMOS devices.

Figure 6:
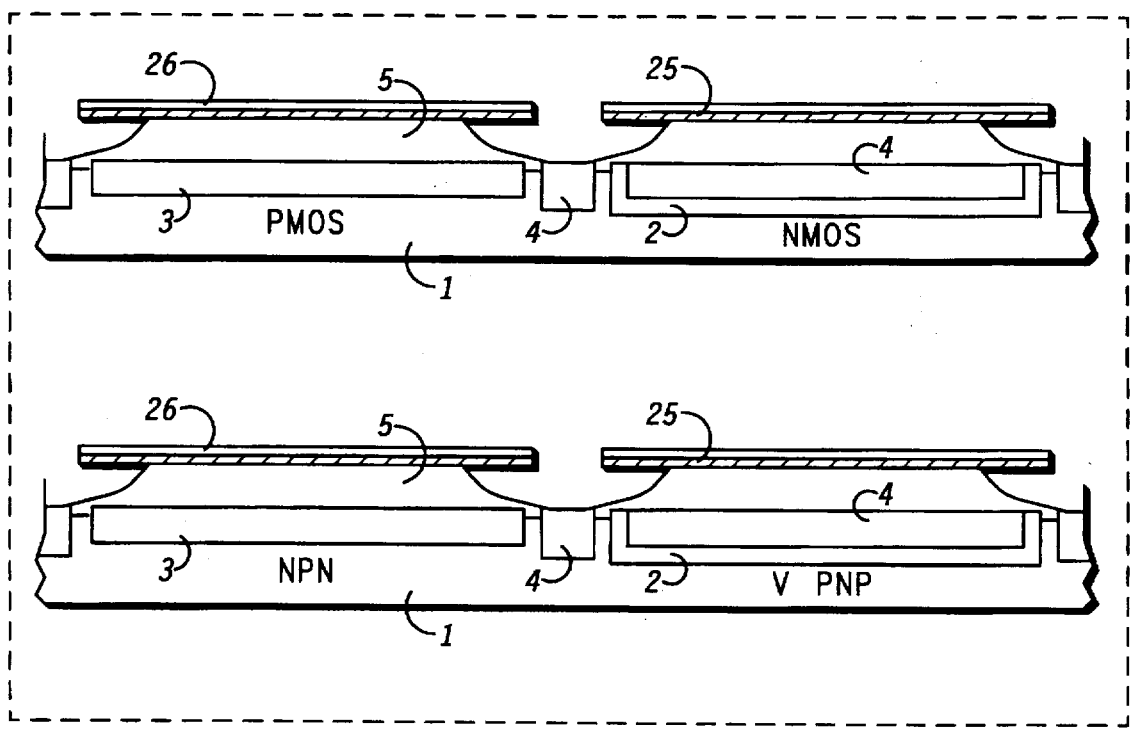

After a thermal oxidation, growing an oxide layer 25 of approximately 700Å thickness, as shown in FIG. 6, a silicon nitride layer 26, approximately 1250Å thick, is deposited by a Low Pressure Chemical Vapor Deposition (LPCVD) Process. Areas for providing deep isolation between the N– and N+ buried layers 2 and 3, respectively, are defined during a fourth masking step. Windows are then prepared through the oxide layer 25 and the nitride layer 26, by a dry etch down to the epitaxial silicon 5. The epitaxial silicon 5 is then wet etched to create moats approximately 9500Å deep, as shown in FIG. 6.

By an oxidizing heat treatment of the wafer, a deep region of oxide 6, approximately 21500Å thick is formed into the moats previously defined, while the nitride layer 26 acts as a mask to oxidation for the rest of the wafer.

Figure 7:
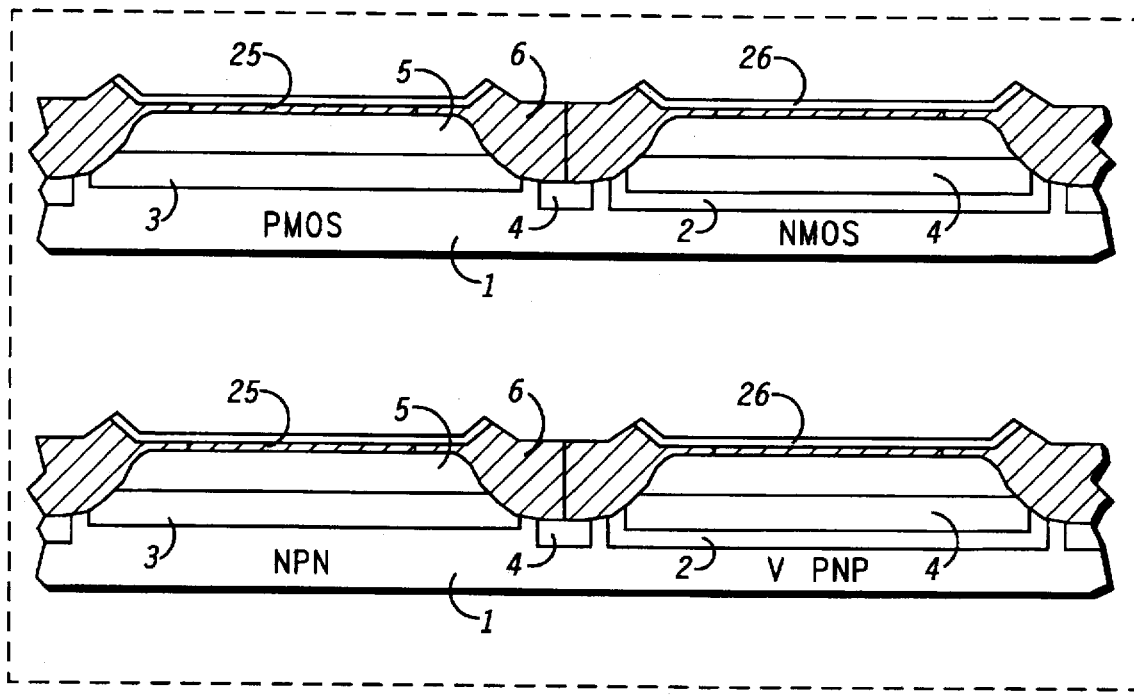

At this stage of the process, the deep region of oxide 6 extends completely through the epitaxial layer 5, as depicted in FIG. 7. To enhance isolation between two adjacent N-type buried layers 3, the P+ buried layer 4 is used under the deep oxide isolation 6, as illustrated in FIG. 7.

Figure 8:
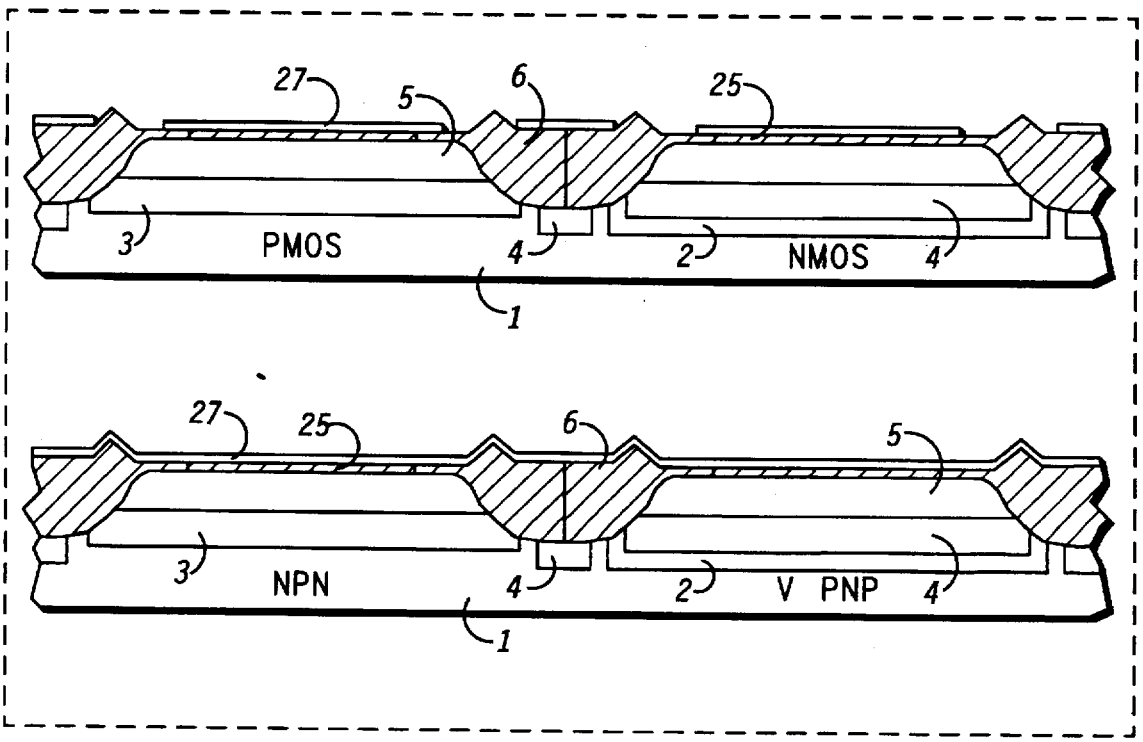

The nitride layer 26 is then stripped off leaving the remaining oxide layer 25 underneath with a thickness of about 500Å. A second nitride layer 27 is deposited by an LPCVD process to a thickness of approximately 1250Å, as shown in FIG. 8.

Areas for providing surface isolation, on either side of the deep oxide isolation 6, are defined by a fifth masking step. Windows are defined through the second nitride layer 27 by a dry etch down to the deep oxide regions 6 underneath, as depicted on FIG. 8. Next a further high pressure heat treatment is performed and a layer of oxide 7 approximately 10000Å thick is grown in the previously defined windows, the remaining nitride layer 27 acting as a mask for the rest of the wafer, as shown in FIG. 9.

Figure 9:
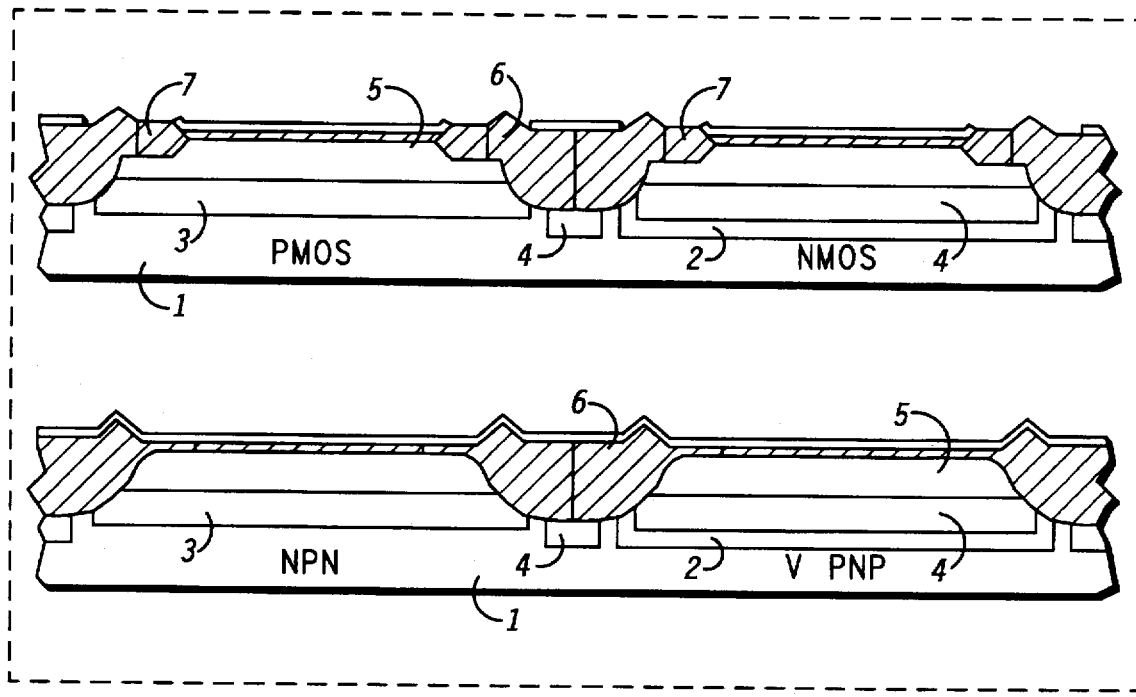

The purpose of this surface isolation oxide 7 is to provide boundaries, contiguous to and on either side of the deep isolation regions 6, for MOS devices formed over two separated buried layers which have to be isolated from each other with a deep region of oxide, as shown in FIG. 9. The whole pad structure consisting of the oxide layer 25 and the nitride layer 27 is then removed.

Figure 10:
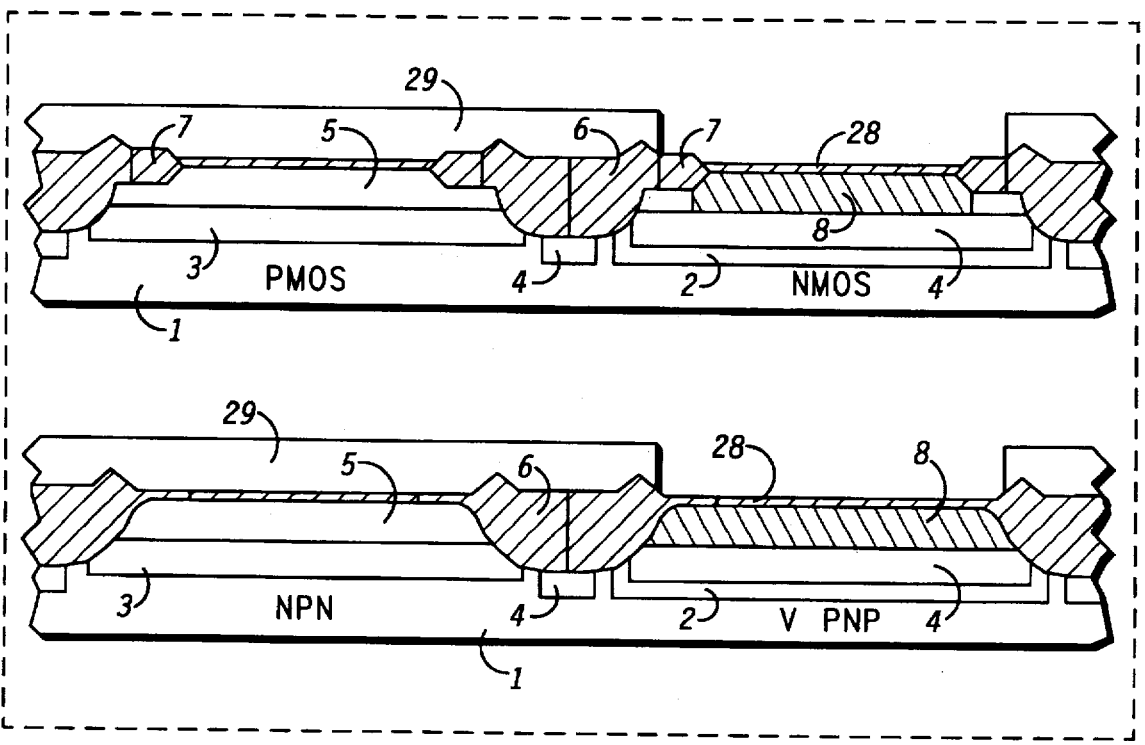

After growing a thermal oxide of approximately 200Å at the silicon surface, used as a screen oxide to the subsequent implantation and indicated by reference numeral 28 in FIG. 10, a sixth masking step is performed by applying a layer of photoresist 29 in which windows, defining P-well regions, i.e. for the body of the NMOS transistor, are defined. Boron ions are then implanted through the windows with a dose of approximately 6E12 at/cm$^2$ and an energy of about 170 KeV to form the P-well regions 8.

Figure 11:
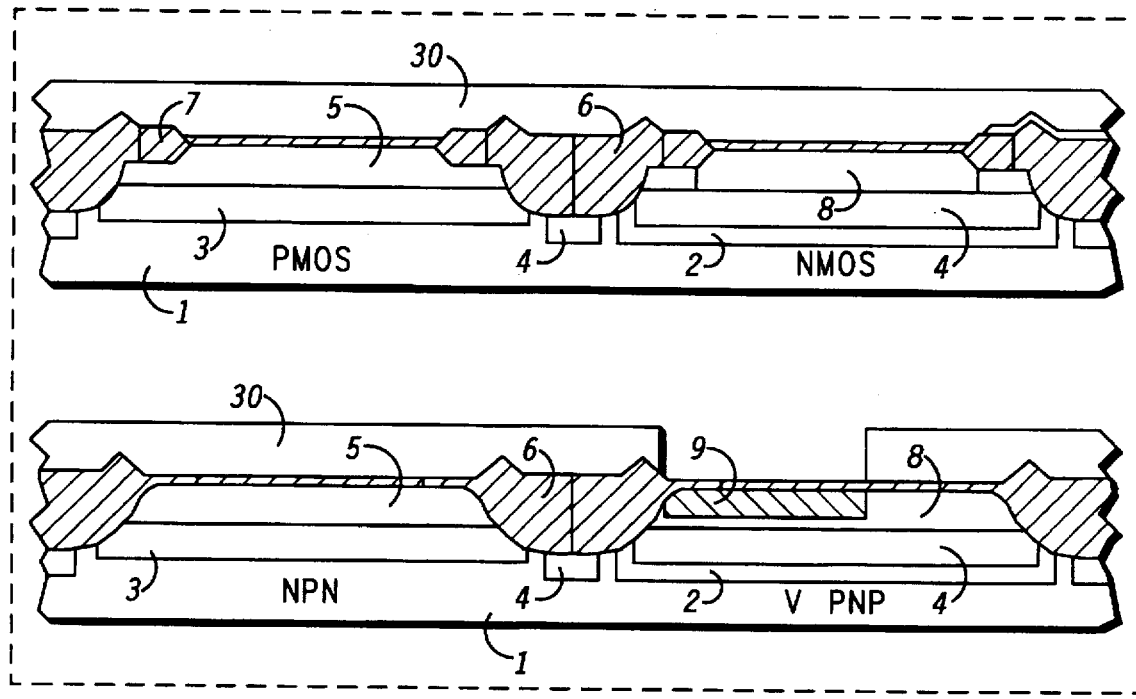

After striping off the photoresist 29, a seventh masking step is done in which a photoresist layer 30 is applied, as shown in FIG. 11, and windows are defined for a phosphorus implant destined to form the N-base of the vertical PNP devices. The phosphorus is implanted with a dose of about 2E13 at/cm$^2$ and an energy of about 40 KeV to form the N-base region 9.

The Boron and Phosphorus ions are redistributed into the silicon with a thermal annealing step, at about 1050° C. for approximately 75 minutes in an $O_2$ atmosphere and then for about 10 minutes in $N_2$ atmosphere, so that the implanted Boron, indicated by reference numeral 8, diffuses deep enough to reach the P+ buried layer 4, as shown in FIGS. 10 & 11. The resulting oxide, with the photoresist 30 is then removed.

At this stage, the P-type NMOS body is created, with a surface doping concentration controlled by the P-well 8 and a low resistance due to the highly doped P+ buried layer 4. The N-base 9 of the vertical PNP device is also formed, diffusing down to the P+ collector 4.

Figure 12:
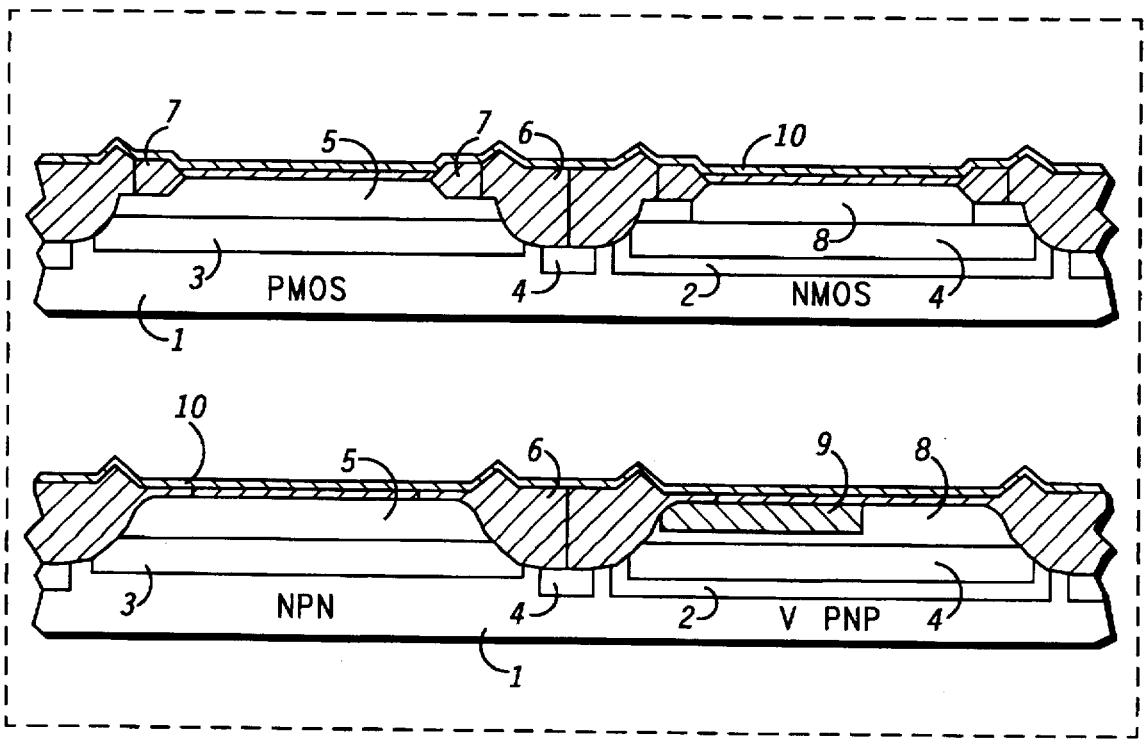
Figure 13:
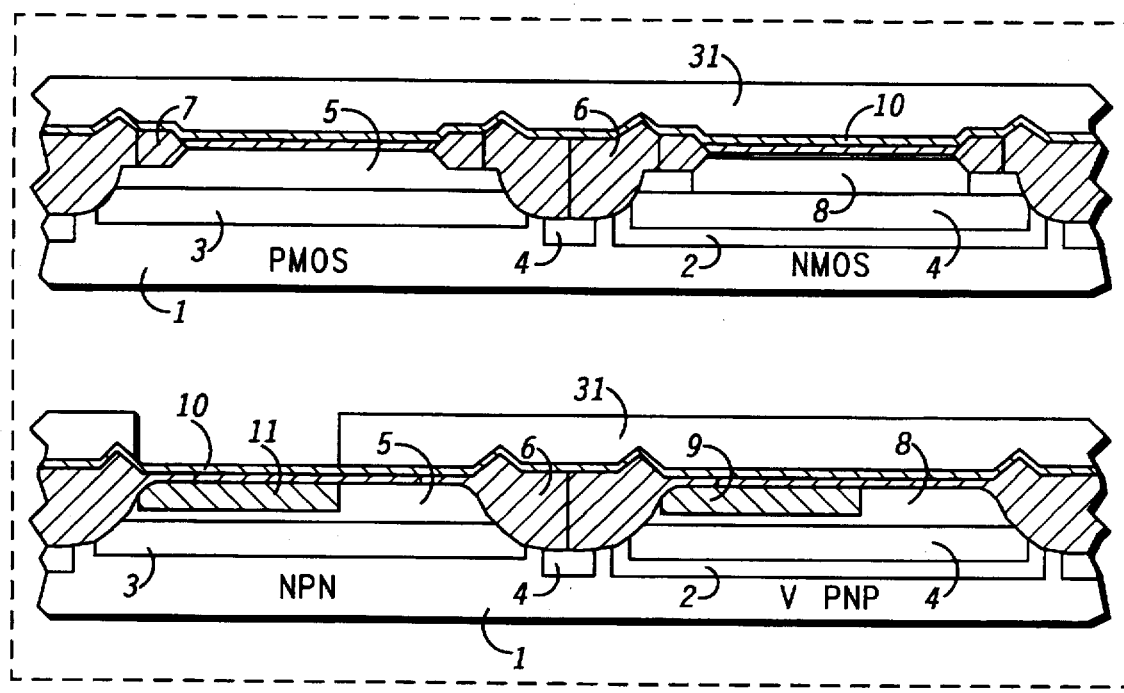
Figure 14:
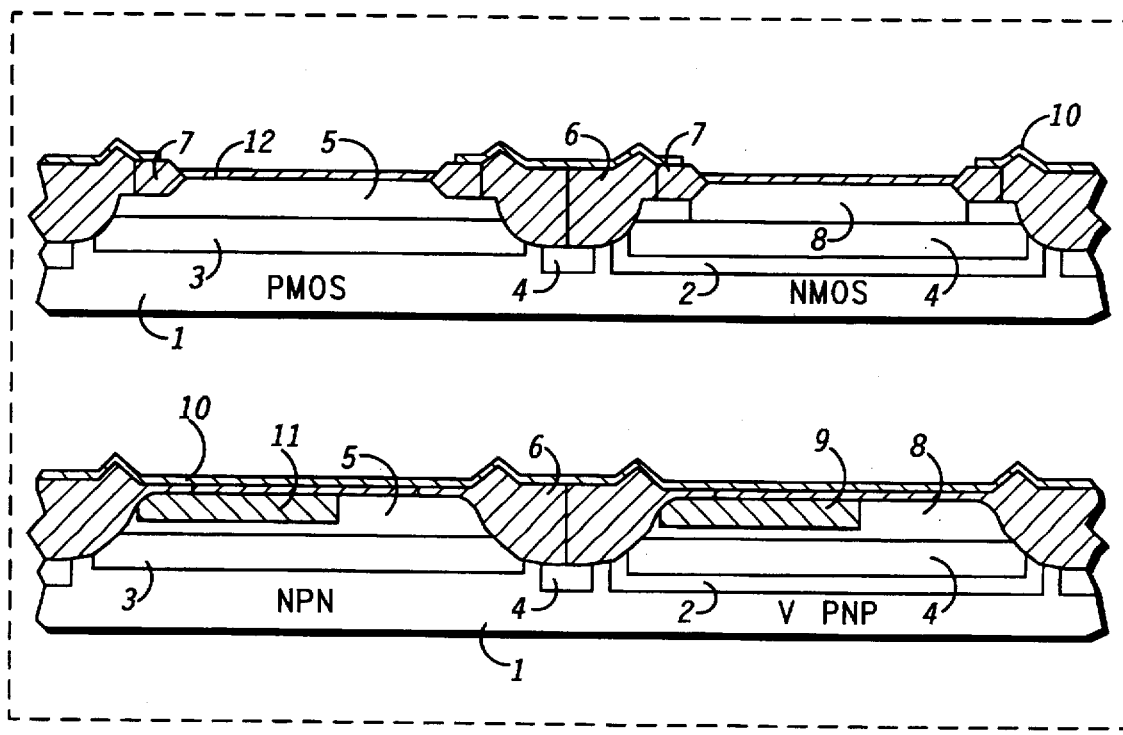

Next, a thermal oxidation is carried out, growing an oxide layer of about 1000Å and depositing thereon an LPCVD nitride layer, also of about 1000Å thickness, as shown in FIG. 12, where the combined oxide/nitride stack is indicated by reference numeral 10. By means of an eighth masking and implantation step, an NPN base is implanted through windows defined in a photoresist layer 31, shown in FIG. 13, and through the stack 10, to form a P-base region 11. The implant dose is approximately 1.15E14 at/cm$^2$ and the implant energy is about 140 KeV. An annealing step at about 900° C., in an $N_2$ atmosphere then follows. The oxide/nitride stack 10 is then removed from the future PMOS and NMOS device areas, in a dry/wet etch, by means of a ninth patterning step, and a gate oxide layer 12 (of about 400Å) is thermally grown, as shown in FIG. 14.

Figure 15:
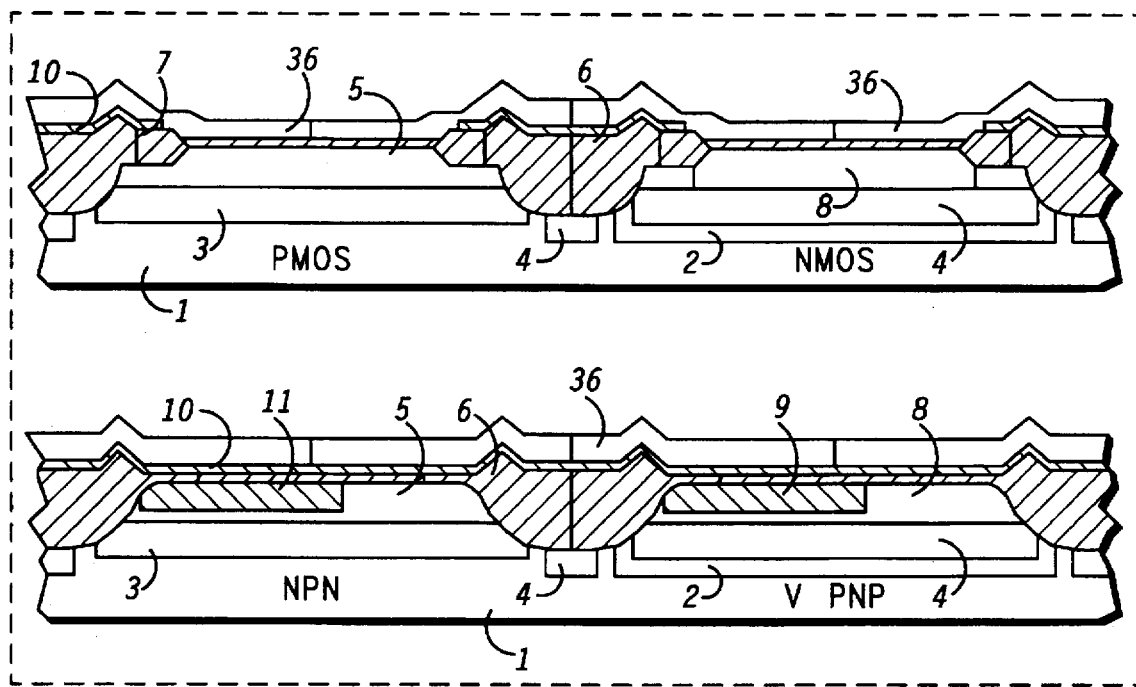
Figure 16:
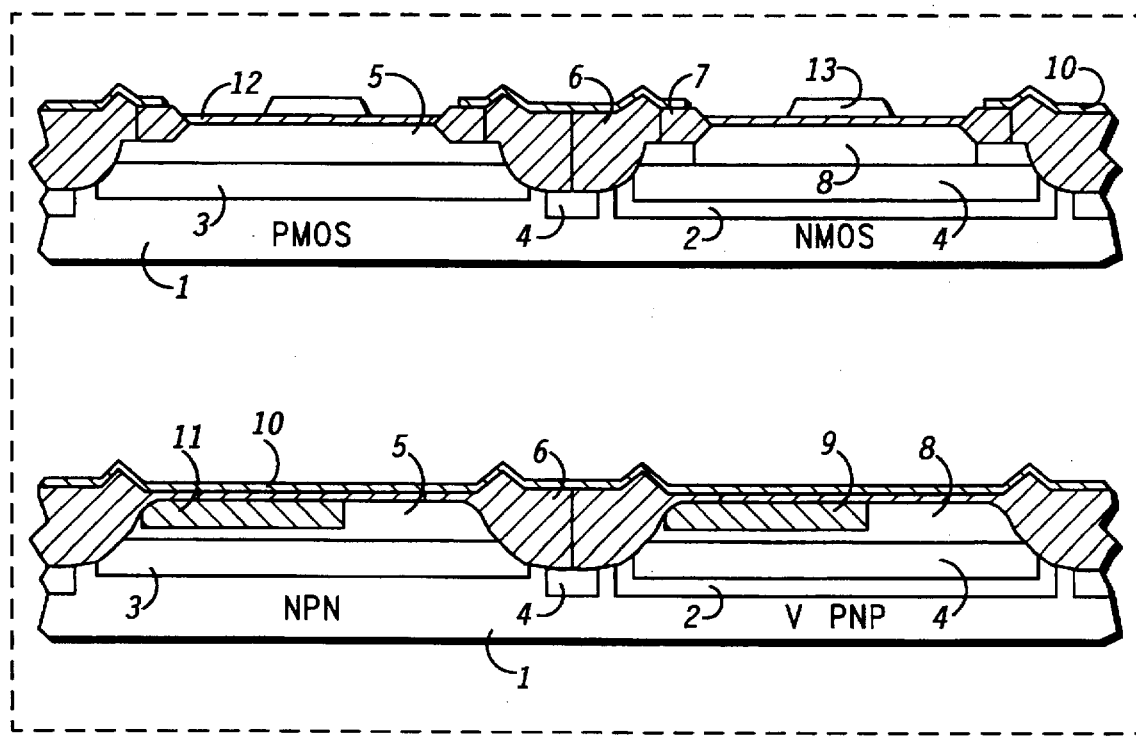

A polysilicon layer 36 with a thickness of about 3500Å is then deposited by a LPCVD process, as shown in FIG. 15, and is doped with phosphorus. The gates 13 of the MOS devices are formed from the polysilicon layer 36 and defined by a tenth patterning step, as shown in FIG. 16, by removal of excess of the polysilicon layer 36.

Figure 17:
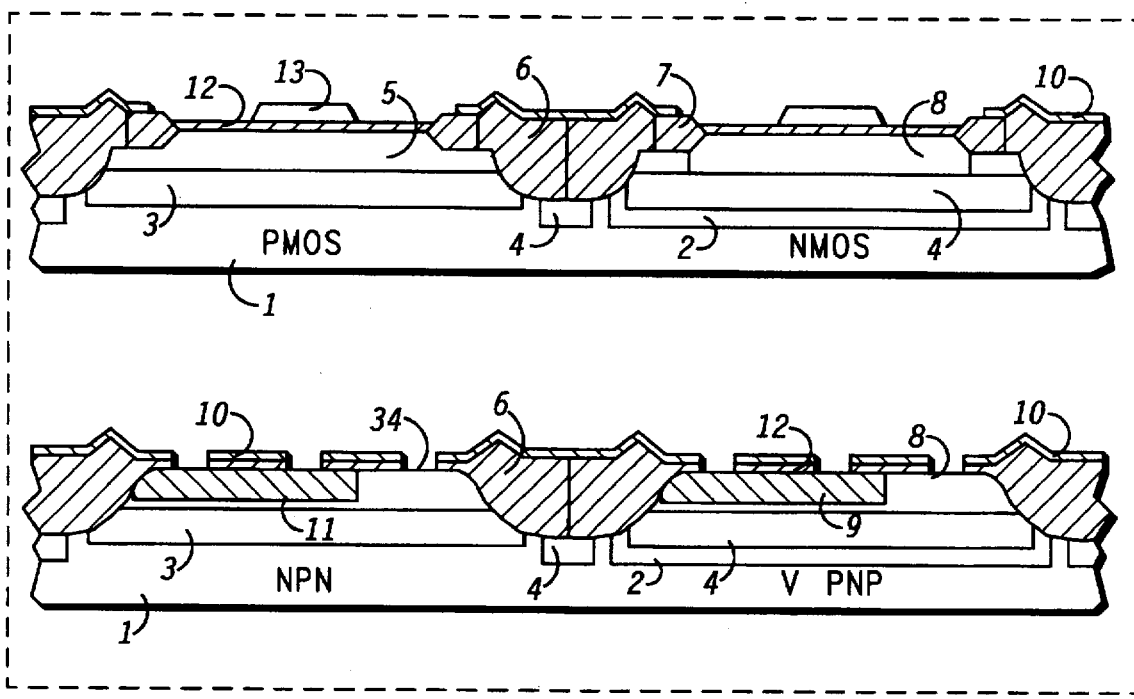
Figure 18:
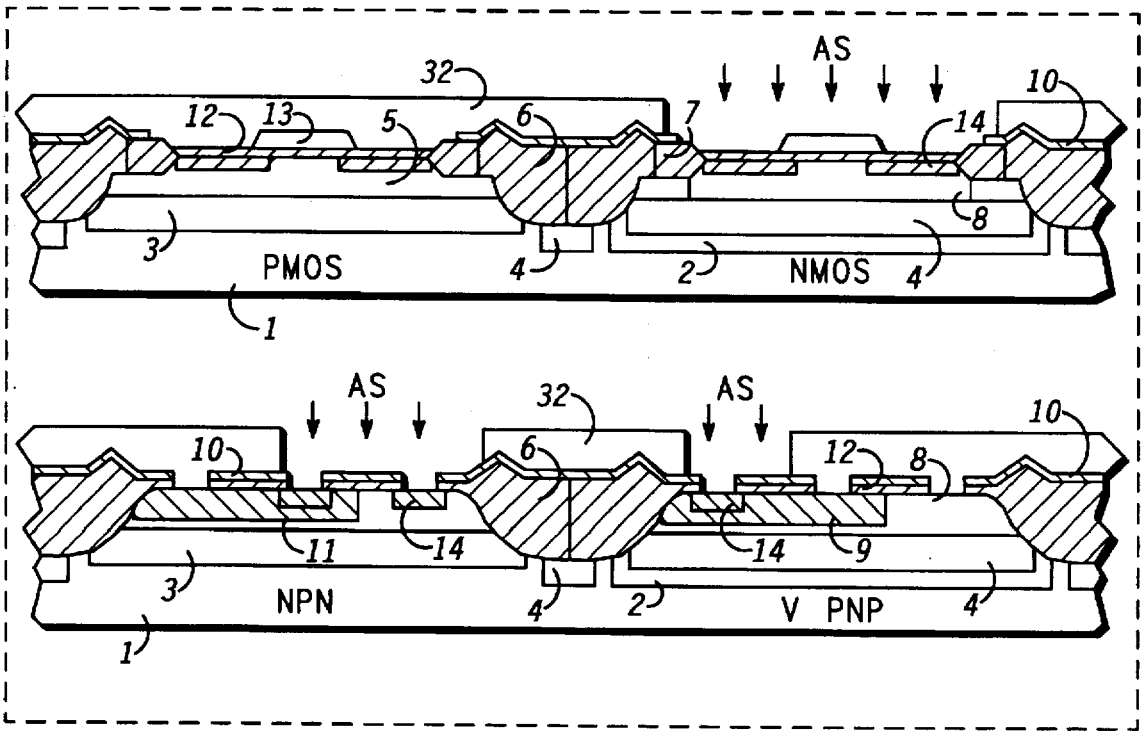

In an eleventh patterning step, suitable windows are defined through a photoresist mask for a dry etch of the oxide/nitride stack 10 to form the different openings for emitter, base and collector contacts, such as that shown by reference numeral 34 in FIG. 17. In a twelfth masking and implant step a photoresist layer 32 is applied, as shown in FIG. 18, and windows are opened to define areas to be implanted with Arsenic. The purpose of this heavy implant is to form, in a single implanting step, electrical contact zones, indicated by reference numeral 14 in FIG. 18, for the collector and emitter regions of the NPN transistor, the base region of the vertical PNP transistor, and the source and drain regions of the NMOS transistor, shielded by and self-aligned with the relative edge of the polysilicon gates 13 and the surface oxide isolation 12. The Arsenic dose is about 1.4E15 at/cm$^2$ and the energy is approximately 30 KeV.

Figure 19:
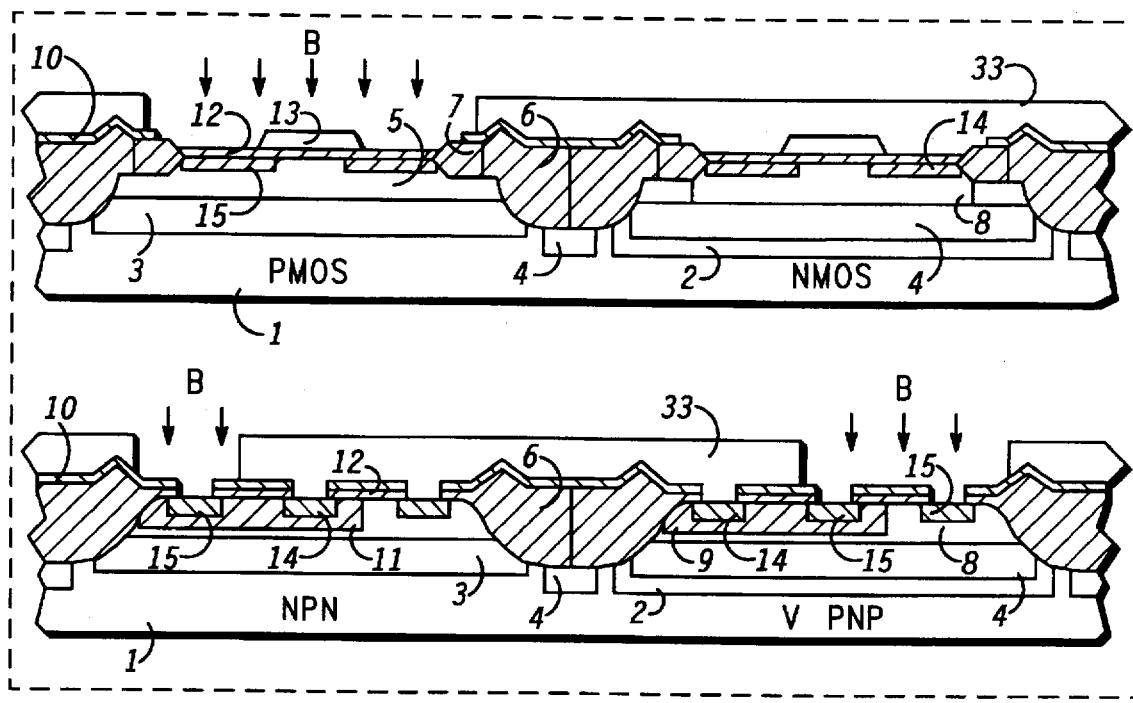

After arsenic implant annealing, at about 1020° C. in an $N_2$ ambient, for about 17 minutes, a thirteenth masking step is performed by applying a photoresist layer 33, shown in FIG. 19, and defining windows in the photoresist layer where a boron implant is done. The purpose of this heavy boron implant is to form, in a single masked implant step, the electrical contact zones, indicated by reference numeral 15 in FIG. 19, for the emitter and collector regions of the vertical PNP transistor, the base region of the NPN transistor, and the source and drain regions of the PMOS transistor, shielded by and self-aligned with the relative edge of the polysilicon gates 13 and the surface oxide isolation 12. This implant is then annealed in an $N_2$ ambient, at about 900° C. for approximately 30 minutes and the photoresist layer 33 is removed.

Figure 20:
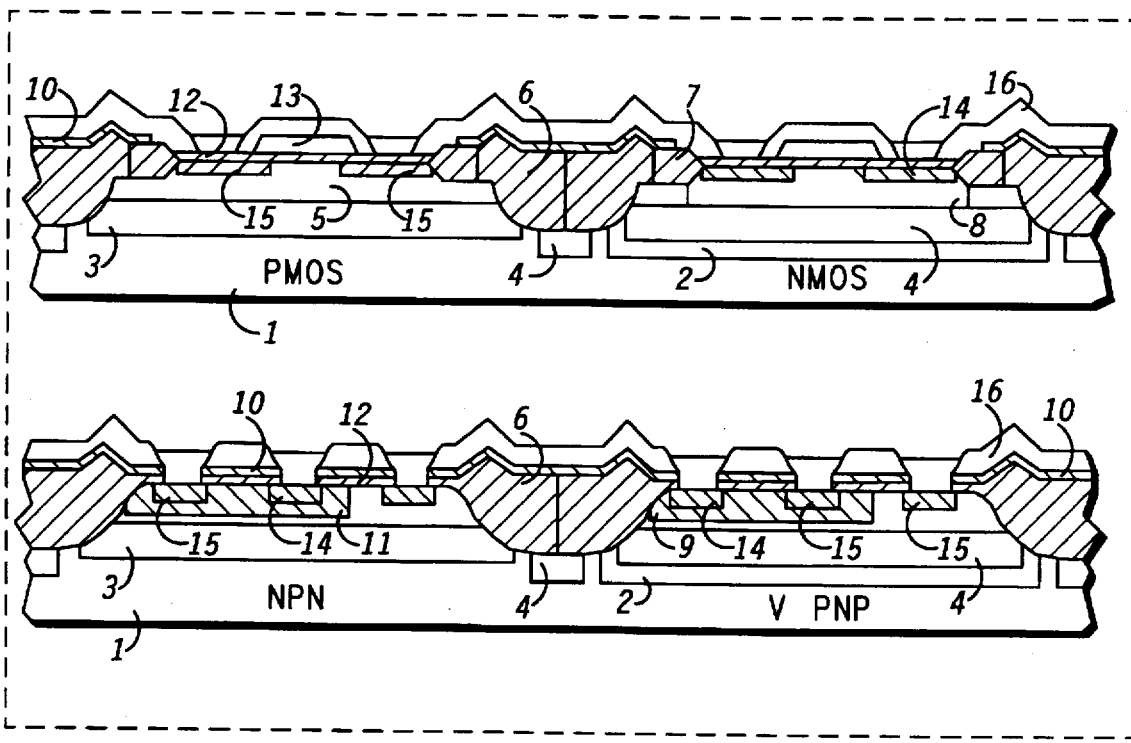
Figure 21:
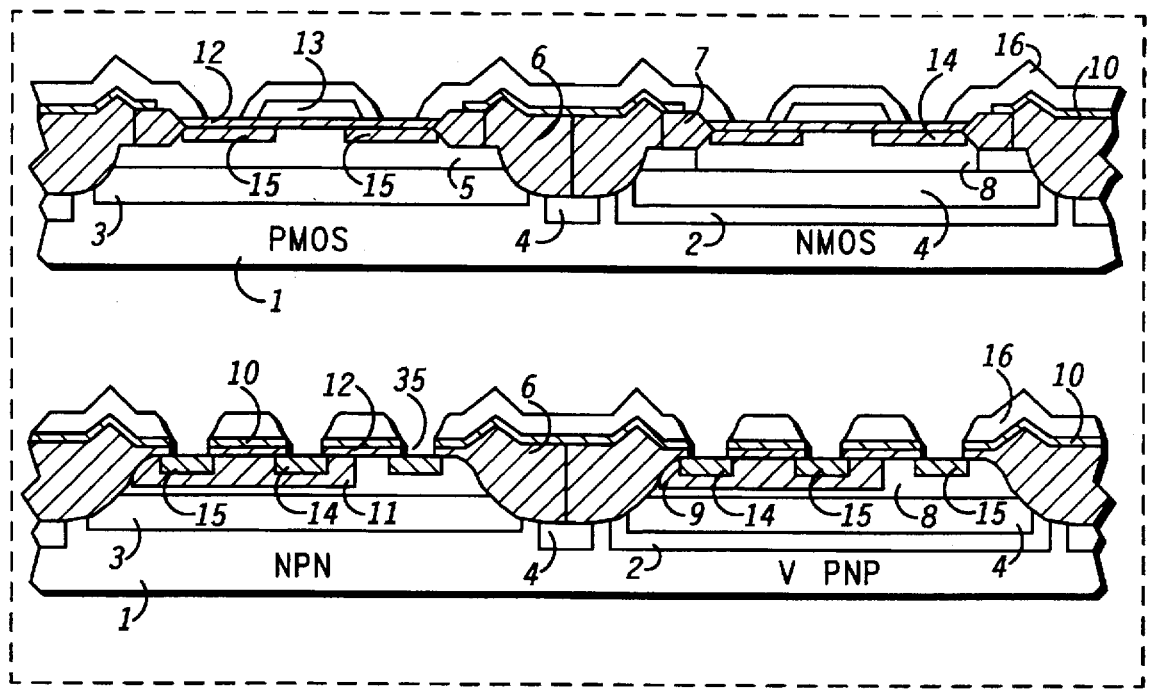

The process continues with a plasma-enhanced vapor deposition (PECVD) step of a first thin undoped layer of oxide, so-called tetraethyl orthosilicate (TEOS), followed immediately with a second layer of phosphorus- and boron-doped TEOS (BPTEOS). A reflow treatment is then performed. The combined stack of TEOS and BPTEOS, is indicated by reference numeral 16 in FIG. 20. During a fourteenth patterning step contact openings 35 are formed in the combined TEOS/BPTEOS stack by a dry removal of the combined stack 16, as is shown in FIG. 21.

Figure 22:
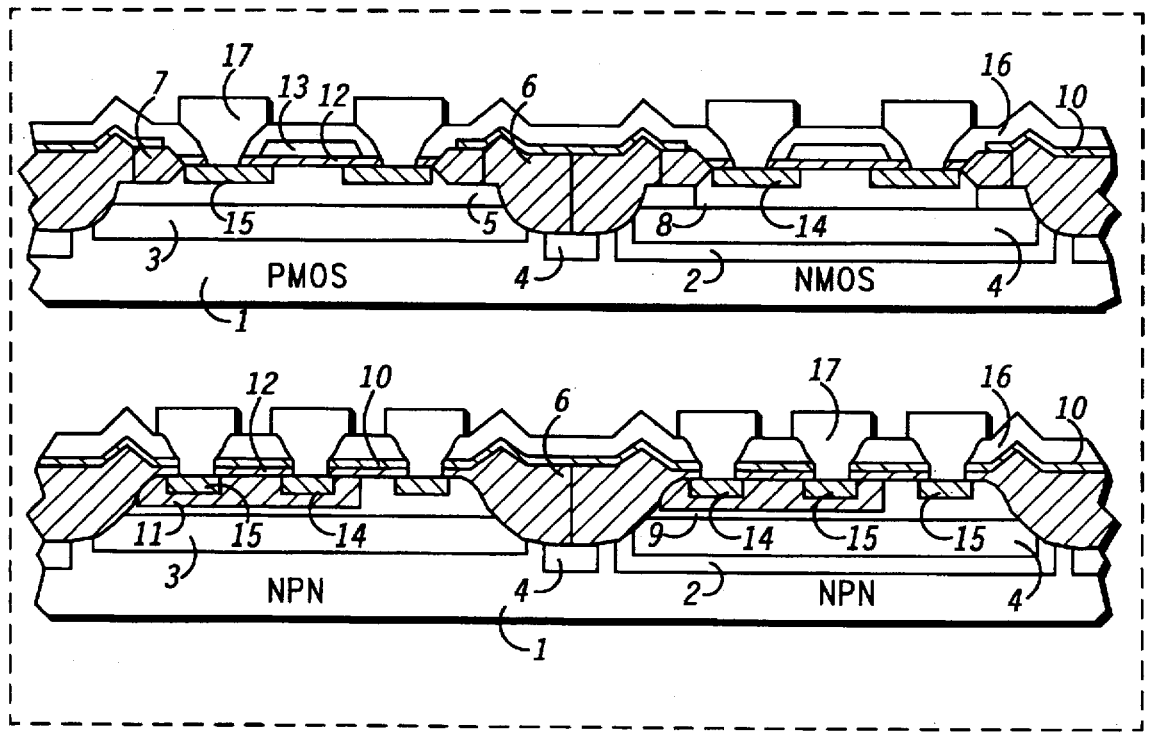

Platinum silicide alloy (PtSi) is then formed in all the contact openings. A titanium/tungsten (TiW) layer is then deposited, followed by a copper/silicon/aluminum alloy (AlCuSi) deposition. Both layers are patterned by a fifteenth masking step and an attack of the two layers is performed, providing the metallic interconnections of the different contacts. The total composite layer, formed with PtSi/TiW/AlCuSi, is indicated by reference numeral 17 in FIG. 22.

Figure 23:
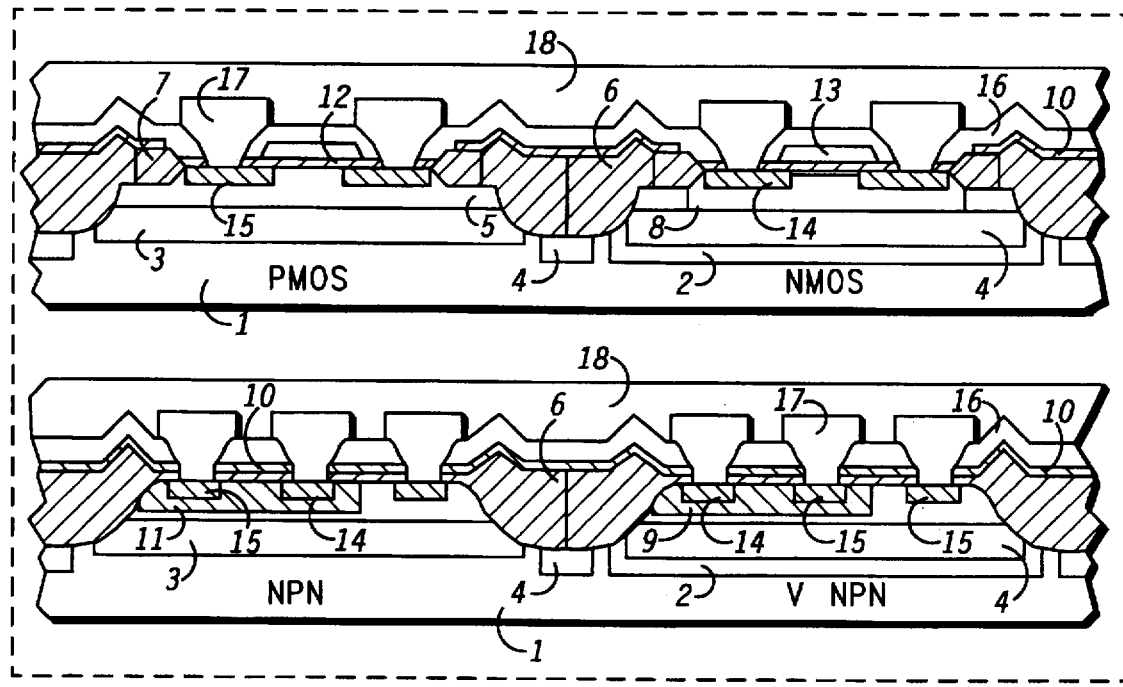

An insulating passivation layer of silicon nitride 18 is deposited by a plasma-enhanced vapor deposition (PECVD) process, as shown in FIG. 23, and the pad areas are defined by means of a sixteenth masking step. Attack of the passivation layer 18 and polishing of the rear of the wafer 1 complete the sequence of the fabrication steps.

Thus, both bipolar and MOS devices have been manufactured, according to the invention, on a single integrated circuit using the same manufacturing process.

Figure 24:
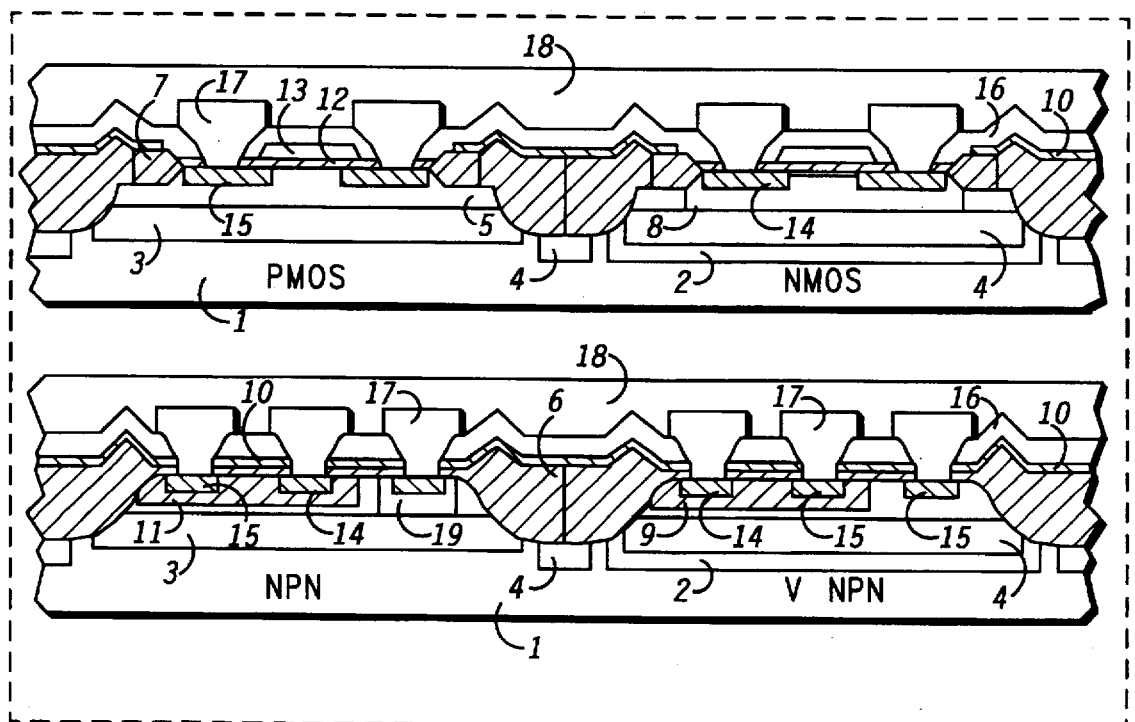
FIG. 24 shows a possible variation in the structure of the NPN device.

It will be appreciated that although only one particular embodiment of the invention has been described in detail, various modifications and improvements can be made by a person skilled in the art without departing from the scope of the present invention. For example, during the sequence of operations of the fabrication process, passive circuit elements such as resistors, capacitors, diodes, etc., required by the particular integrated circuit being made, may be easily formed. The fabrication process may also be modified by adding further masking steps for improving existing devices. For example, to decrease the collector access of the NPN transistor, a deep electric N+ contact 19, as shown in FIG. 24, can be formed to reach through the N+ buried layer, i.e. the collector of the NPN transistor. Another possibility is an optional mask and implant step to adjust the threshold voltages of the MOS devices to a specific desired value.

We claim:

1. A method of manufacturing integrated circuits having both bipolar and CMOS devices on the same chip, the method comprising the steps of:

providing a P– silicon substrate appropriately doped to provide an N– buried layer region for at least one vertical PNP device and to provide N+ buried layer regions for at least one PMOS device and at least one vertical NPN device;

providing a P+ region in the N– buried layer region and in the P-substrate for at least one NMOS device;

providing an N– epitaxial layer over the P+, N+ and N– regions;

providing a P well region in the N– epitaxial layer of the NMOS device extending to the P+ region and in a first part of the N– epitaxial layer of the vertical PNP device extending to the P+ region;

providing an N base region in a second part of the N– epitaxial layer of the vertical PNP device;

providing a P base region in a first part of the N– epitaxial layer of the vertical NPN device;

simultaneously providing:
an N+ region on part of the P base region of the vertical NPN device to form the emitter thereof,
an N+ region on a second part of the N– epitaxial layer of the vertical NPN device to form the collector contact thereof,
N+ regions on first and second parts of the P well region of the NMOS device to form the source and drain thereof, and
an N+ region on the N base region of the vertical PNP device to form the base contact thereof; and simultaneously providing:
P+ regions on the P well and N base regions of the vertical PNP device to form the collector and emitter contacts thereof,
P+ regions on first and second parts of the N– epitaxial layer of the PMOS device to form the source and drain thereof, and
a P+ region on part of the P base region of the vertical NPN device to form the base contact thereof.

2. A method of manufacturing integrated circuits according to claim 1, further comprising the step of:

providing a deep N+ region in the second part of the N– epitaxial layer of the vertical NPN device before the N+ region forming the collector contact thereof is formed.

3. A method of manufacturing integrated circuits according to claim 1, wherein an N– buried layer region is provided in the P– substrate for the NMOS device before the P+ region is provided therein.

4. A method of manufacturing integrated circuits according to claim 1, wherein the base region of the vertical NPN device is provided on a P++ region provided in the second part of the N– epitaxial layer of the vertical NPN device.

* * * * *